United States Patent [19]

Tanaka et al.

[11] Patent Number: 4,476,580
[45] Date of Patent: Oct. 9, 1984

[54] AUTOMATIC CONTINUOUS TUNING CONTROL APPARATUS FOR A RECEIVER

[75] Inventors: Kouji Tanaka, Oora; Osamu Ikeda, Ooizumi; Yoshio Nakayama, Menuma, all of Japan

[73] Assignees: Sanyo Electric Co., Ltd.; Tokyo Sanyo Electric Co., Ltd., both of Tokyo, Japan

[21] Appl. No.: 272,088

[22] Filed: Jun. 10, 1981

[30] Foreign Application Priority Data

Jun. 17, 1980 [JP] Japan .................................. 55-82254
Jun. 17, 1980 [JP] Japan .................................. 55-82255

[51] Int. Cl.³ ............................................. H03J 7/22
[52] U.S. Cl. .................................. 455/164; 455/165; 455/168
[58] Field of Search ............... 455/164, 165, 168, 182, 455/183-185

[56] References Cited

U.S. PATENT DOCUMENTS

| | | |
|---|---|---|
| 4,031,549 | 6/1977 | Rast et al. |
| 4,077,008 | 2/1978 | Rast et al. ........................... 455/164 |
| 4,081,752 | 3/1978 | Sumi ..................................... 455/168 |
| 4,245,349 | 1/1981 | Kumaoka et al. ................... 455/165 |
| 4,254,506 | 3/1981 | Henderson et al. ................. 455/164 |
| 4,264,977 | 4/1971 | Deiss .................................... 455/182 |
| 4,271,434 | 6/1981 | Sakamoto ............................ 455/164 |
| 4,344,187 | 8/1972 | Ogita et al. .......................... 455/182 |

FOREIGN PATENT DOCUMENTS

| | | |
|---|---|---|
| 28100 | 6/1981 | European Pat. Off. |
| 2015279 | 9/1979 | United Kingdom. |
| 1561544 | 2/1980 | United Kingdom. |

*Primary Examiner*—Jin F. Ng
*Attorney, Agent, or Firm*—Darby & Darby

[57] ABSTRACT

A tuning control apparatus of a receiver having an electronic tuner comprises a tuning voltage generating circuit including a window comparator, a charge pump and a low-pass filter. An S curve signal is applied to the window comparator to make a search controlled by means of a voltage synthesizer system using the S curve signal until the receipt of a broadcasting signal. If an optimum tuning point is established through the search control, the local oscillation frequency at that time is counted to provide frequency division ratio data. A phase-locked loop is operated as a function of the frequency division ratio data on the occasion of the above described optimum tuning point, whereby reception of the broadcasting signal is continued. Preferably, an automatic frequency control operation is performed before the phase-locked loop is operated.

14 Claims, 17 Drawing Figures

HIGH IMPEDANCE

AUTOMATIC CONTINUOUS TUNING CONTROL APPARATUS FOR A RECEIVER

BACKGROUND OF THE INVENTION

1. Field of the Invention

The present invention generally relates to a tuning control apparatus of a receiver having an electronic tuner. More specifically, the present invention relates to a tuning control apparatus having an automatic search function.

2. Description of the Prior Art

A tuning control system of a receiver having an electronic tuner employing a voltage controlled variable reactance device has already been proposed and two types of such system set forth in the following are typically known. One of them is a frequency synthesizer system employing a phase-locked loop, while the other is a voltage synthesizer system employing a digital-/analog converter. An example of such frequency synthesizer system is dislcosed in U.S. Pat. No. 4,081,752 issued Mar. 28, 1978 to Yasuaki Sumi. On the other hand, an example of such voltage synthesizer system is disclosed in U.S. Pat. No. 3,968,440 issued July 6, 1976 to George John Ahni, III.

A frequency sysnthesizer system employing a phase-locked loop controls the local oscillation frequency through a comparison of a frequency divided signal of the local oscillation frequency of the tuner with a reference signal obtained from a crystal controlled oscillator, thereby to control or determine the receiving frequency independently of the detection characteristic of the receiver. Therefore, the frequency synthesizer system involves a problem that even if the local oscillation frequency is controlled to be apparently tuned to the frequency of the electric wave the same does not necessarily become an optimum tuning point due to an error or a frequency drift and the like of a ceramic filter employed in an intermediate frequency stage subsequent to the tuner. Furthermore, another problem as set forth in the following is further involved. More specifically, although such frequency synthesizer system can be employed to perform an automatic search function, the same can be applied only to a receiver of a frequency band in the case of a tuning control apparatus which is capable of an automatic search function by the use of a frequency synthesizer system, when compatibility of shortening of a search time period and a stop accuracy is taken into consideration. Therefore, assuming different territories such as the Europe and the United States where channel space is different, separate tuning control appratuses need be designed and employed.

On the other hand, since a voltage synthesizer system is structured such that the local oscillation frequency is controlled based on a tuning state and a detection characteristic of a receiver, the same can be applied with ease to a frequency band of any channel space while an optimum tuning point can be readily attained. However, since a voltage synthesizer system fails to control the local oscillation freqeuncy based on the reference signal of the crystal controlled oscillator, a problem is still involved in stability of reception as compared with a frequency synthesizer system employing a phase-locked loop.

SUMMARY OF THE INVENTION

In brief, the present invention comprises a tuning control apparatus of a receiver having an electronic tuner, wherein a tuning control voltage is provided by means of a voltage synthesizer until the receiver receives a desired broadcasting signal, i.e. on the occasion of a station selecting operation and after the desired electric wave is once received the optimum tuning state is maintained by a frequency synthesizer.

The present invention can be readily applied even to frequency bands of different channel spaces, while the optimum tuning point can be easily attained. As a result, a receiver of high tuning accuracy and stability is provided. More specifically, the inventive receiver performs a search control such that the local oscillation frequency is varied responsive to a signal representative of a tuning state until a desired broadcasting signal is caught. Therefore, a difference in channel spaces such as in the case of the frequency bands in such territories as the Europe and the United States where the channel spaces of the frequency bands are different does not exert any influence upon a station selecting operation. After a desired broadcasting signal is once caught and the optimum tuning point is established, the frequency division ratio corresponding to the optimum tuning point is generated and the local oscillation frequency is controlled by a phase-locked loop based on the above described frequency division ratio, and therefore stability of tuning is improved.

In a preferred embodiment of the present invention, a tuning voltage generator circuit for generating a tuning voltage is shared both with the voltage synthesizer and the frequency synthesizer and accordingly the embodiment is implemented with a simple circuit structure.

In another preferred embodiment of the present invention, an automatic frequency control (AFC) is performed as a function of an S curve signal when the receiver catches a desired broadcasting signal, whereupon the operation is switched to a receiving operation by means of the phase-locked loop. The automatic frequency control being performed prior to enabling of the phase-locked loop as done in the embodiment makes it possible to establish the optimum tuning point with much higher accuracy. Preferably, a tuning voltage generating circuit for the automatic frequency control may be further shared with that which was commonly used to the previously described voltage synthesizer and the frequency synthesizer In a further preferred embodiment of the present invention, an upper edge frequency and a lower edge frequency of a receivable frequency band is stored in the receiver and detection is made based on the stored frequency data whether the receiving frequency has exceeded the upper edge frequency and/or the lower edge frequency. If and when the receiving frequency is about to exceed such edge frequencies, the phase-locked loop is enabled, whereby the receiving frequency is forced to the upper edge frequency and/or the lower edge frequency, as the case may be. According to the preferred embodiment under discussion, a problem is eliminated, which problem is that the receiver may receive a frequency of a separate frequency band as the allowed frequency band is exceeded by the receiver. Accordingly, a receiver is provided which is capable of being assuredly adapted to the standard of the FTZ or the DOC adopted in West Germany or Canada.

Accordingly, a principal object of the present invention is to provide an improved tuning control apparatus of a receiver having an electronic tuner, that can be readily adapted to the frequency bands of any channel spaces and can receive a desired broadcasting signal with stability at an optimum tuning point.

One aspect of the present invention resides in a tuning control-apparatus of a receiver which is capable of achieving the above described object without necessity of any complicated circuit structure.

Another aspect of the present invention resides in a tuning control apparatus of a receiver which is capable of more assuredly establishing the optimum tuning point.

A further aspect of the present invention resides in a tuning control apparatus of a receiver having an electronic tuner which will not receive any frequencies other than those allowed for the receiver.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
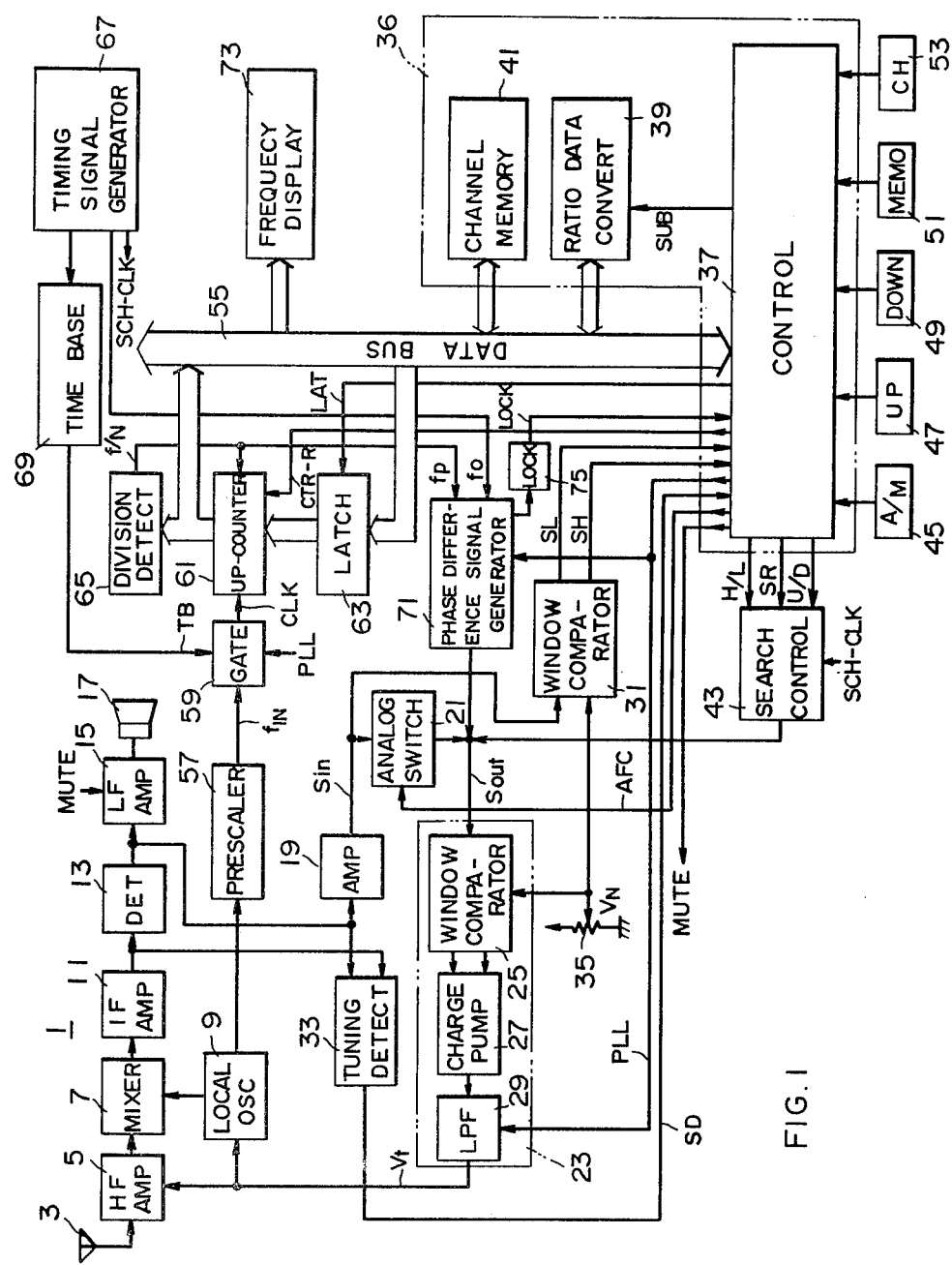
FIG. 1 is a block diagram showing one embodiment of the present invention.

FIG. 1 is a block diagram showing one embodiment of the present invention. It is pointed out that although all of the FIG. 1 embodiment and those embodiments to be described subsequently show the examples in which the present invention is applied to an FM receiver, the present invention can be equally applicable to an AM receiver as well.

Referring to FIG. 1, the reference numeral 1 generally denotes an FM receiver having an electronic tuner. The FM receiver 1 comprises an antenna 3 and an FM signal received by the antenna 3 is amplified by a high frequency amplifier 5 and the output therefrom is applied to a mixer 7. The mixer 7 is connected to receive a local oscillation signal from a local oscillator 9 which comprises such a voltage controlled variable reactance device (not shown) as a variable capacitance diode. The mixer 7 serves to mix two given input signals to provide an intermediate frequency signal. The intermediate frequency signal is amplified by an intermediate frequency amplifier 11 and the output therefrom is detected by an FM detector 13. The detected output, i.e. a sound signal obtained from the detector 13 is applied to a low frequency amplifier 15 and the amplified output is applied to a speaker 17 to drive the same. Since such FM receiver 1 is well-known, it is not believed necessary to describe the same in more detail. The present invention is directed to an apparatus for receiving a broadcasting signal with accuracy and stability in such receiver having an electronic tuner.

Figure 2:
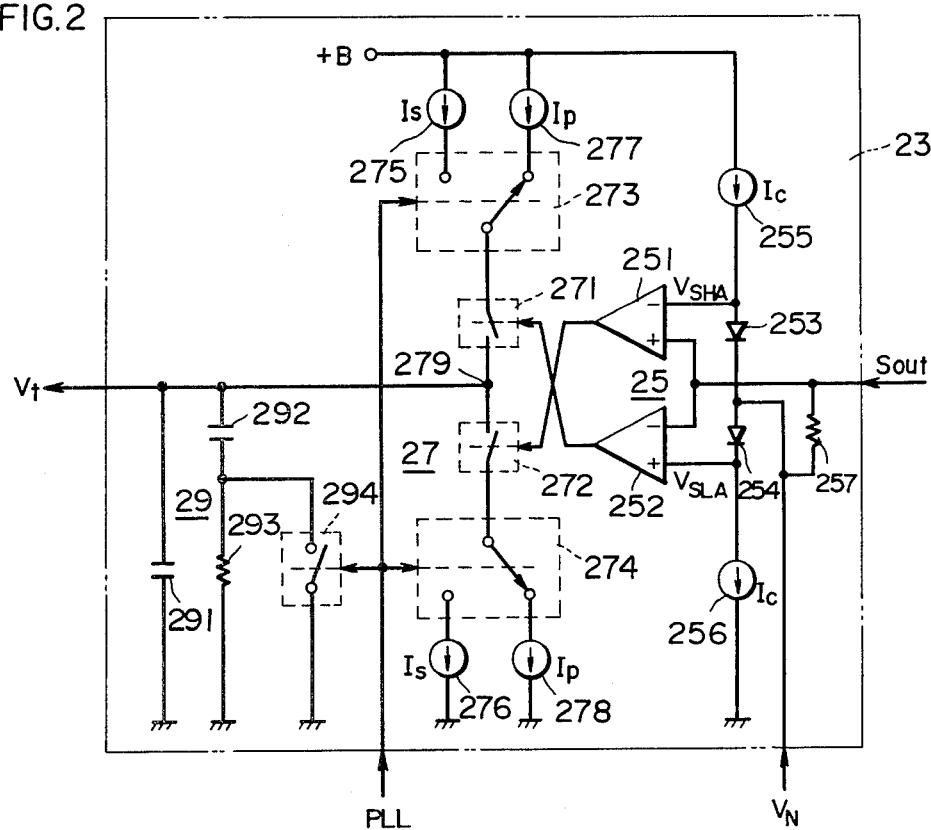
FIG. 2 is a schematic diagram showing one example of a tuning voltage generating circuit.

An S curve signal obtained from the detector 13 is amplified by the amplifier 19 and is applied to an analog switch 21 as a signal Sin and is also applied to one input of a window comparator 31. The output of the analog switch 21 and the outputs from a search control 43 and a phase difference signal generator 71 to be described subsequently are applied in an OR fashion to a tuning voltage generating circuit 23 as a signal Sout. The tuning voltage generating circuit 23 is shown in detail in FIG. 2 and comprises a window comparator 25 connected to receive the signal Sout at the input stage thereof. The window comparator 25 comprises two operational amplifiers 251 and 252 connected to a current path including a constant current source 255, diodes 253 and 254 and a constant current source 256. The above described current path is supplied with the bias voltage $V_N$ from a bias circuit 35 including a variable resistor, for example. The constant current path is thus employed to secure that a predetermined relation of two thresholds may not be changed even if a bias voltage $V_N$ is changed. The signal Sout is applied to the + input and the − input of the two operational amplifiers 251 and 252, respectively. A bias resistor 257 is connected between the input path and the current path. The outputs from the two operational amplifiers 251 and 252 constituting the window comparator 25 are applied to a constant current charge pump 27, so that the constant current charge pump 27 may control a charging/discharging operation of a capacitor included in a low-pass filter 29. The constant current charge pump 27 comprises a constant current path including two kinds of constant current sources 275, 276 and 277, 278. The current path comprises switches 273, 271, 272 and 274 connected in series in the order just described. The switches 271 and 272 are on or off controlled responsive to the outputs from the operational amplifiers 252 and 251 constituting the window comprator 25. The switches 273 and 274 function to select a current Is or Ip flowing through the current path by switchably selecting the constant current sources 275 or 277 and 276 or 278 responsive to a signal PLL to be described subsequently. These switches 271 to 274 may be semiconductor switching devices. The constant current sources 275 and 276 are enabled on the occasion of a search operation by means of a voltage synthesizer system, whereas the constant current sources 277 and 278 are enabled on the occasion of a tuning operation to an optimum tuning point by means of the phase-locked loop (a frequency synthesizer system). Accordingly, it will be appreciated that the tuning voltage generating circuit 23 is commonly used both in the voltage synthesizer system and the frequency synthesizer system. The low-pass filter 29 comprises a parallel connection of a capacitor 291 and a series connection of a capacitor 292 and a resistor 293 and the input thereof is connected to a junction 279 of the constant current path included in the charge pump 27 and a direct current tuning voltage Vt is obtained from the output thereof. The low-pass filter 29 comprises a switch 294 for switchably selecting the time constant, on the occasion of the enabling of the phase-locked loop and a resistor 293 connected in parallel with the switch 294. The switch 294 is turned on or off responsive to the signal PLL such that the switch 294 is turned off when the signal PLL is at the high level. Thus the switch 294 is provided to insert the dumping resistor 293 for the purpose of converging the local oscillation frequency to a desired frequency on the occasion of the enabling of the phase-locked loop. The tuning voltage generating circuit 23 functions such that when the given signal voltage Sout becomes higher than the threshold level $V_{SHA}$ of one operational amplifier 251 of the window comparator 25 the switch 272 included in the charge pump 27 is turned on, thereby to discharge the two capacitors 291 and 292 included in the low-pass filter 29, whereby the tuning voltage Vt is decreased. When the signal voltage Sout becomes lower than the threshold level $V_{SLA}$ of the other operational amplifier 252, the switch 271 included in the charge pump 27 is turned on and the capacitors 291 and 292 included in the low-pass filter 29 are charged with a constant current, whereby the tuning voltage Vt is increased. Thus, it would be appreciated that the tuning voltage generating circuit 23 generates as a whole a tuning voltage Vt which is variable as a function of the given input voltage Sout. Meanwhile, the constant current sources 275 and 276 included in the charge pump 27 are selected such that the current amounts thereof are smaller than those of the other constant current sources 277 and 278. Accordingly, the low-pass filter 29 is charged or discharged with a larger current on the occasion of enabling the phase-locked loop as compared with the case of a station selecting operation by the voltage synthesizer system.

Returning again to FIG. 1, the tuning voltage Vt from the tuning voltage generating ciurcuit 23 is applied to the high frequency amplifier 5 and the local oscillator 9 included in the FM receiver 1, thereby to control the tuning frequency. The output from the amplifier 19, i.e. the S curve signal Sin is applied to the window comparator 31. The other input of the window comparator 31 is connected to receive the voltage $V_N$ obtained from the bias circuit 35.

Figure 3:
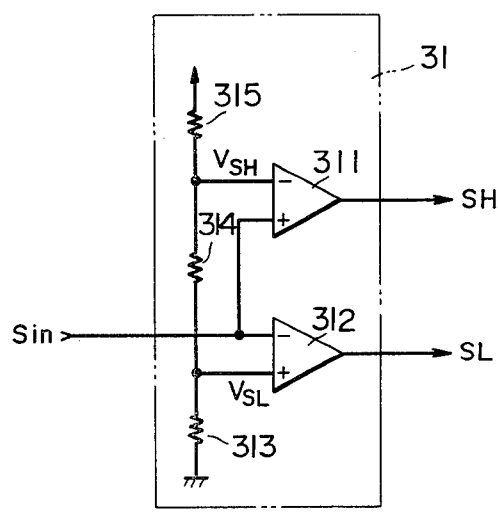
FIG. 3 is a schematic diagram showing a window comparator for search control.
Figure 4:
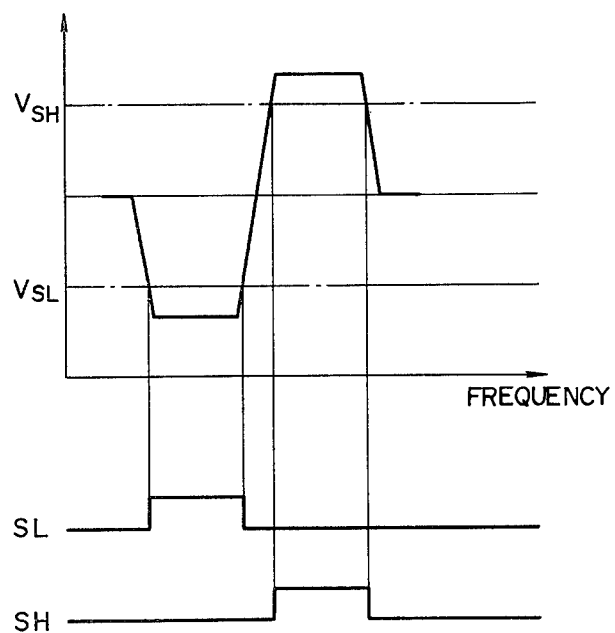
FIG. 4 is a graph showing waveforms for explaining an operation of the FIG. 3 diagram.

The window comparator 31 comprises two operational amplifiers 311 and 312 and three series connected resistors 313, 314 and 315, as shown in FIG. 3. The signal Sin from the amplifier 19 is applied to the + input and the − input of the operational amplifiers 311 and 312, respectively. The operational amplifiers 311 and 312 are adapted to have threshold voltages $V_{SH}$ and $V_{SL}$, respectively. The window comparator 311 level detects the voltage Sin. The threshold level $V_{SH}$ of the window comparator 31 is set to be higher than the threshold level $V_{SHA}$ of the previously described window comparator 25 and the threshold level $V_{SL}$ is set to be lower than the threshold level $V_{SLA}$. Now referring to FIG. 4, the operation of the FIG. 3 circuit will be described. Consider a case where the threshold levels $V_{SL}$ and $V_{SH}$ have been set as shown in FIG. 4 and the signal Sin has been applied as shown in FIG. 4. In such a situation, when the signal Sin is lower than the threshold level $V_{SL}$, i.e. the tuning frequency by the receiver 1 is shifted to be lower than the correct tuning point, the signal SL obtained from one operational applifier 312 becomes the high level. Conversely, in the case where the signal Sin is higher than the threshold level $V_{SH}$, i.e. the tuning frequency has been shifted to be higher than the correct turing point, the signal SH obtained from the other operational amplifier 311 becomes the high level. Accordingly, the direction of the frequency being changed on the occasion of a station selecting operation can be determined based on these signals SL and SH.

For the purpose of making such determination, the output signals SL and SH from the window comparator 31 are applied to a control implemented by such a circuit 36 as a microprocessor, for example. Accordingly, it would be appreciated that the window comparator 31 is utilized on the occasion of station selecting operation, i.e. on the occasion of a search or station selecting operation by the voltage synthesizer system.

Seven signals H/L, SR, U/D, MUTE, AFC, PLL and CTR-R are obtained from a control functional block 37 of microprocessor 36. The signal H/L directs a search speed on the occasion of a search operation, the signal SR directs initiation and termination of such search operation, and the signal U/D directs a search direction. The signal MUTE is applied to the low frequency amplifier 15 to direct a muting operation. The signal AFC is applied to the analog switch 21 to direct an automatic frequency control operation responsive to the S curve signal. The analog switch 21 is responsive to the signal AFC obtained from the control 37 to provide the signal Sin to the tuning voltage generating circuit 23. The signal PLL directs a receiving operation by the frequency synthesizer system after the optimum tuning point is established by the receiver 1. The signal CTR-R directs the resetting of an up-counter 61 to be described subsequently.

Figure 5:
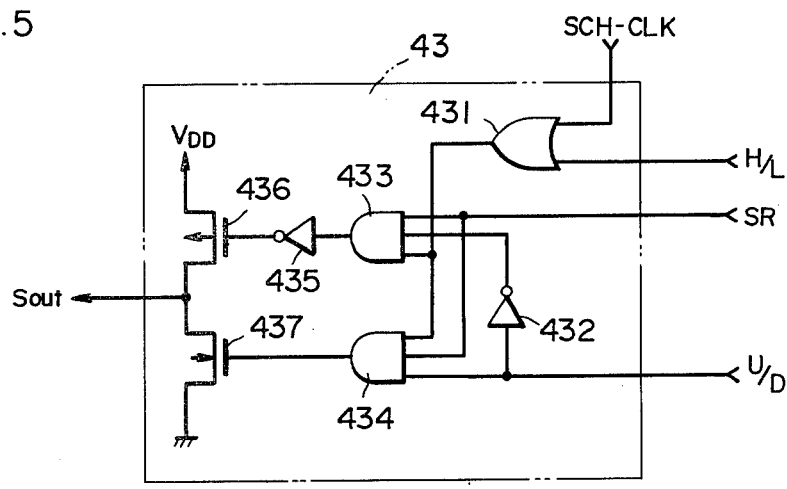
FIG. 5 is a schematic diagram showing one example of a search control.

The signals H/L, SR and U/D obtained from the control 37 are applied to a search control 43. The search control 43 is shown in detail in FIG. 5. More specifically, the search control 43 comprises an OR gate 431 which is connected to receive the signals SCH-CLK and H/L. The singal SCH-CLK is obtained from a timing signal generator 67 to serve as a clock for a low speed search operation. The output from the OR gate 431 is applied to three-inputted AND gates 433 and 434, respectively. The other inputs of the AND gate 433 are connected to receive the signal SR and an inversion of the signal U/D by means of an inverter 432. The other inputs of the AND gate 434 are connected to receive the signals SR and U/D. The output of the AND gate 433 is inverted by an inverter 435 and is applied to the gate of a P-channel field effect transistor 436. The output of the AND gate 434 is applied to the gate of an N-channel field effect transistor 437. These two field effect transistors 436 and 437 are connected in series and one end of the series connection is connected to the voltage $V_{DD}$, while the other end of the series connection is connected to the ground. The signal Sout is obtained from the series connected junction and the same is applied as an input to the tuning voltage generating circuit 23. The search control 43 is responsive to the state of the given three signals H/L, SR and U/D, thereby to generate a three-value search control signal of "the high level", "the low level" and "the high impedance". More specifically, if and when the field effect transistor 436 is rendered conductive and the field effect transistor 437 is rendered non-conductive as a function of the states of these three signals H/L, SR, U/D, the signal Sout becomes "the high level" and in a reversed case the signal Sout becomes "the low level". If and when these two field effect transistors 436 and 437 are both rendered non-conductive, the signal Sout becomes "the high impedance". On the occasion of a station selecting operation, the signal Sout obtained from the search control 43 is applied to the tuning voltage generating circuit 23, with the result that the tuning voltage Vt is controlled by the search control 43.

Figure 6:
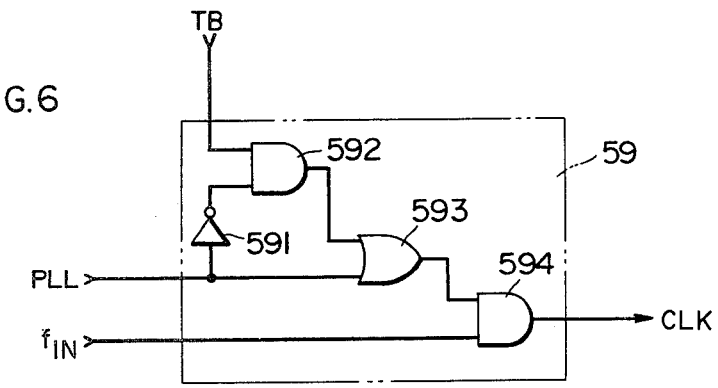
FIG. 6 is a schematic diagram showing one example of a gate circuit.

Now returning again to FIG. 1, the local oscillation signal obtained from the local oscillator 9 included in the receiver 1 is applied to the mixer 7 and is frequency divided at a predermined frequency division ratio, say 1/100, by means of a prescaler 57 ard the signal $f_{IN}$ obtained from the prescaler 57 is applied to the gate circuit 59. As shown in more detail in FIG. 6, the gate circuit 59 receives three inputs, i.e. the frequency signal $f_{IN}$, the time base signal TB and the signal PLL. The time base signal TB is a signal of say 10 m sec obtained from the time base circuit 69. The time base circuit 69 receives a timing signal from a time signal generator 67. The gate circuit 59 comprises an AND gate 592 and one input of the AND gate 592 is supplied with the time base signal TB while the other input is supplied with an inversion of the signal PLL by means of the inverter 591. The output from the AND gate 592 and the signal PLL are applied to the inputs of an OR gate 593. The output from the OR gate 593 and the signal $f_{IN}$ obtained from the prescaler 57 are applied to an AND gate 594. The output from the AND gate 594 is applied to a count input of an up-counter 61 as a signal CLK. When the signal PLL is the low level, the signal $f_{IN}$ restricted by the time base signal TB is obtained as the signal CLK. When the signal PLL is the high level, the singal $f_{IN}$ is obtained as the signal CLK without regard to the time base signal TB.

Figure 7:
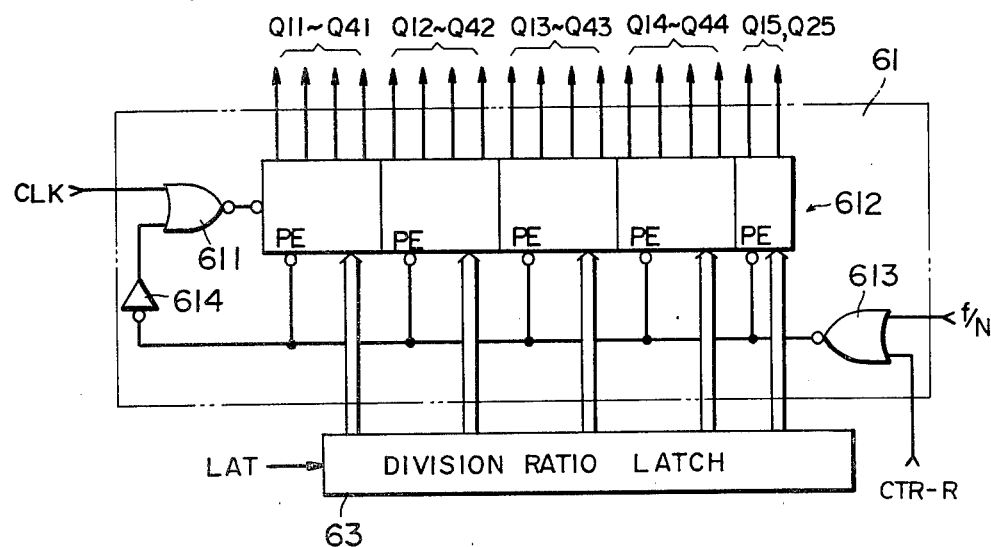
FIG. 7 is a block diagram showing one example of an upcounter.

The up-counter 61 is shown in more detail in FIG. 7. The up-counter 61 comprises a NOR gate 611 receiving the signal CLK obtained from the gate circuit 59 (FIG. 1) as one input thereto. The output from the NOR gate 611 is inverted and the inverted output is applied to the count input of a counter group 612. The counter group 612 comprises four 4-bit BCD up-counters and one 2-bit BCD up-counter connected in a cascade fashion. The up-counter 61 further comprises a two imputted NOR gate 613 two imputs of which are connected to receive the signal f/N and CTR-R. The signal f/N is a frequency division detected output obtained from a frequency division detecting circuit 65 to be described subsequently on the occasion of enabling the phase-locked loop. The output from the NOR gate 613 is applied to a preset enable terminal of the respective BCD up-counters and is also inverted by an inverter 614 to be applied to the other input of the previously described NOR gate 611. The signal CTR-R is obtained from the control 37 as described previously and is a counter reset signal of say at every 50 m sec. The counter group 612 of the up-counter 61 receives a frequency division ratio obtained from a latch circuit 63 for latching frequency division ratio data to be described subsequently, and counts or frequency divides the signal CLK, thereby to provide the 18-bit count outputs Q11-Q41, Q12-Q42, Q13-Q43, Q14-Q44 and Q15, Q25. The up-counter 61 is responsive to the local oscillation frequency to serve as a counter for displaying the receiving frequency with a frequency display 73 and also serves as a portion of a programmable frequency divider constituting the phase-locked loop. The data transmission between these components 63, 61, 65, 73 and 36 is made through a data bus 55.

Figure 8:
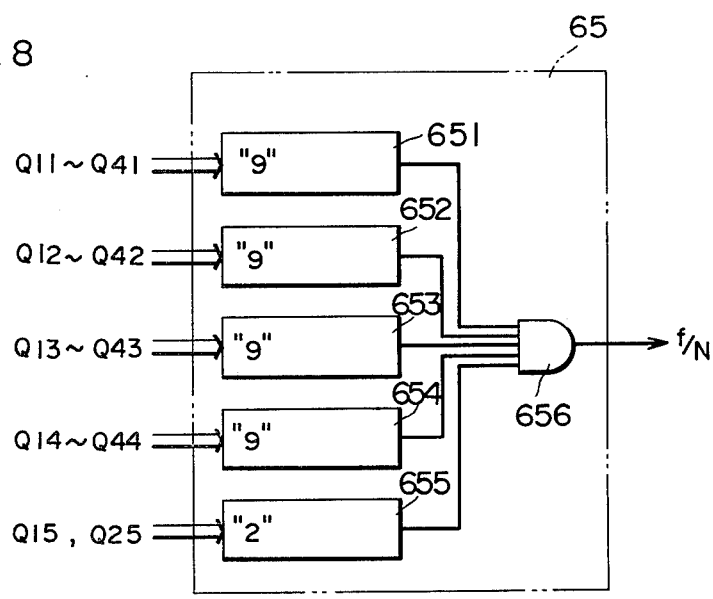
FIG. 8 is a block diagram showing one example of a frequency division detecting circuit.

The frequency division detecting circuit 65 is shown in more detail in FIG. 8. More specifically, the frequency division detecting circuit 65 receives the count outputs Q11-Q41, Q12-Q42, Q13-Q43, Q14-Q44 and Q15, Q25 from the up-counter 61. The count outputs Q11-Q14 to Q41-Q44 are applied to the corresponding detectors 651 to 654 at every corresponding bits, respectively. The outputs Q15 and Q25 are applied to the corresponding detector 655. When the respective inputs are "9", the detectors 651 to 654 provide a detected output at the high level. Likewise, when the input is "2", the detector 655 provides a detected output at the high level. The detected outputs from these detectors 651 to 655 are applied to an AND gate 656. The signal f/N obtained from the AND gate 656 is obtained at the high level each time the up-counter 61 counts the numerical value "29999".

As shown in FIG. 1, the up-counter 61 constituting a portion of the programmable frequency divider of the phase-locked loop is connected to receive the frequency division ratio data from the latch circuit 63 for setting the frequency division ratio. The frequency division ratio data being latched in the latch circuit 63 is obtained through the data bus 55 from the frequency division ratio data converting circuit 39 included in the circuit 36, which may be a microprocessor, for example. The latch circuit 63 is connected to the control 37 to receive a signal LAT therefrom, whereby the frequency division ratio obtained from the frequency division ratio data converting circuit 39 is latched in the latch circuit 63 in response to the signal LAT.

Figure 9:
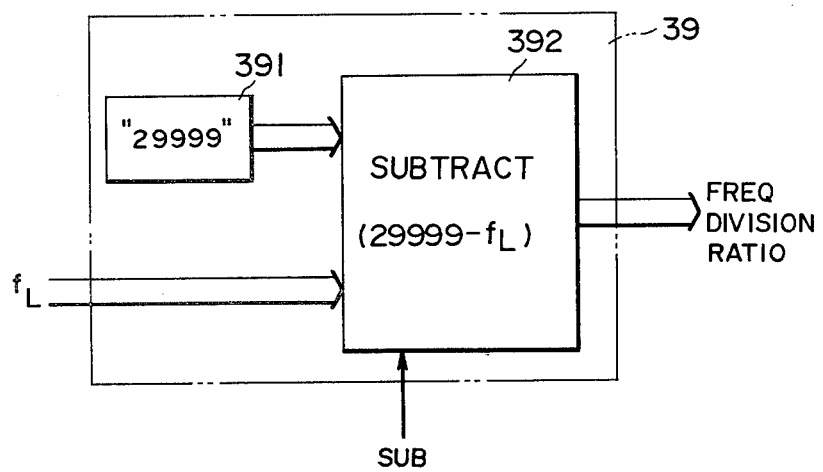
FIG. 9 is a block diagram showing one example of a frequency division ratio data converting circuit.

The frequency division ratio data converting circuit 39 is shown in more detail in FIG. 9. The frequency division ratio data converting circuit 39 is connected to receive the local oscillation frequency data $f_L$ from the up-counter 61 through the data bus 55. The frequency data $f_L$ is applied to one input of a subtractor 392 as a subtrahend input. The other input of the subtractor 392 is connected to receive as a minuend the numerical value "29999" from the numerical value generator 391. The numerical value "29999" corresponds to the maximum count value of the up-counter 61. The subtractor 392 makes subtraction of "29999 − $f_L$" and the output therefrom is applied to the latch circuit 63 through the data bus 55 as the frequency division ratio data. After the optimum tuning point is established by the voltage synthesizer system, the frequency division ratio data converting circuit 39 is utilized for maintaining the optimum tuning state by means of the frequency synthesizer system. Now consider a case where the local oscillation frequency corrsponding to the optimum tuning point of the broadcasting signal being presently received is say 65.4 MHz, the frequency division ratio of the prescaler 57 is 1/100 and the time base signal TB is 10 m sec. In such a case, the frequency division ratio data being applied from the data converting circuit 39 to the latch circuit 61 is "29999 − 6540 = 23459". Meanwhile, the frequency division ratio data convering circuit 39 is supplied with the signal SUB from the control 37. The signal SUB serves as a subtraction command of the subtractor 392. Since the timing when the frequency division ratio data is latched in the latch circuit 63 is controlled by the signal LAT, the signal SUB may be normally provided to the frequency division ratio data converting circuit 39 during the search operation and the automatic frequency control operation. The signal SUB is obtained a predetermined time period td say 0.4 sec after the automatic frequency control operation is initiated. Whereby the receiver is adapted to deem that the optimum tuning point has been established after the lapse of 0.4 sec after the automatic frequency control operation is initiated.

For the purpose of simplifying a circuit structure, the above described up-counter 61 is shared with a counter for displaying the receiving frequency and a counter for providing the above described frequency division ratio data. The frequency display 73 is coupled to the data bus 55. The frequency display 73 is supplied with the frequency data corresponding to the local oscillation frequency counted by the up-counter 61 through the data bus 55. The frequency display 73 comprises a frequency converter, not shown, for converting the local oscillation frequency into a frequency being displayed, i.e. a receiving frequency and the converted receiving frequency data are displayed by the display, not shown, which may be the well-known liquid crystal display, the light emitting diodes display or the like. Meanwhile, the above described frequency converter has a function of reverse conversion of the receiving frequency to the corresponding local oscillation frequency.

Figure 10:
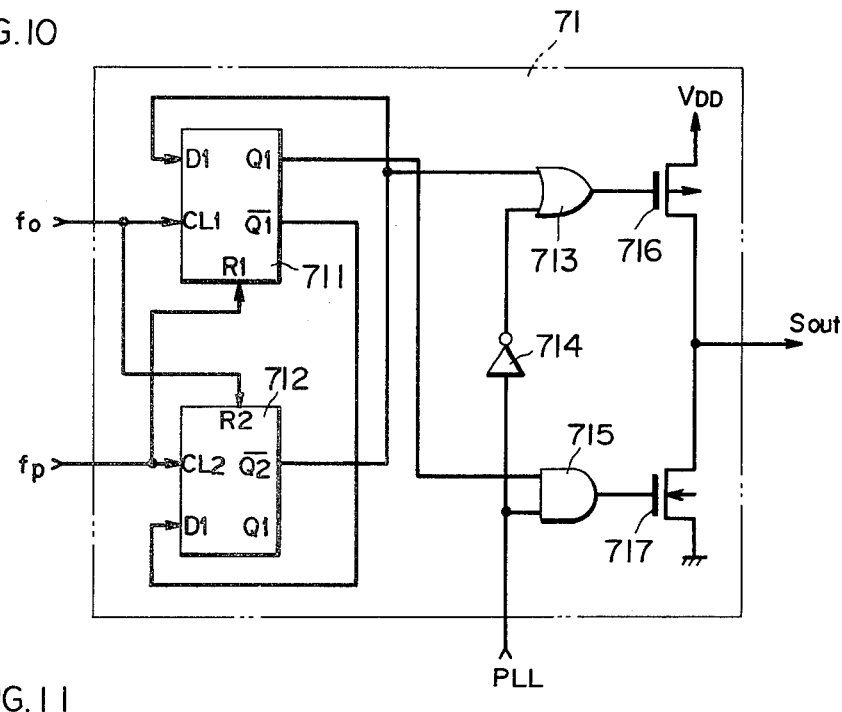
FIG. 10 is a block diagram showing one example of a phase difference signal generating circuit included in a phase-locked loop.
Figure 11:
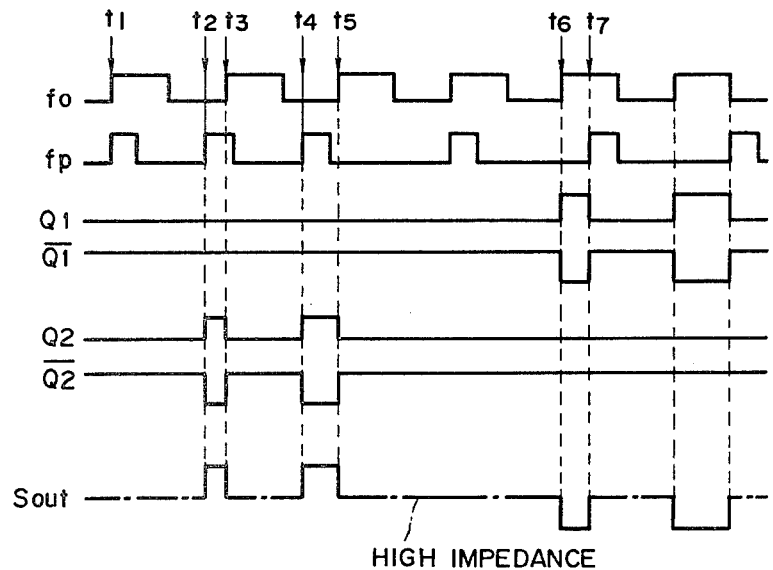
FIG. 11 is a timing chart for explaining an operation of the FIG. 10 diagram.

One input of the phase difference signal generator 71 is supplied with the reference input fo from the timing signal generator 67 and the other input fp of the phase difference signal generator 71 is supplied with the frequency division detected output f/N from the frequency division detecting circuit 65 (FIGS. 1 and 8). The phase difference signal generator 71 is shown in more detail in FIG. 10. The phase difference signal generator 71 comprises two D type flip-flops 711 and 712. The D type flip-flops 711 and 712 each have reset terminals Rl and R2, data terminals D1 and D2, and output terminals Q1, $\overline{Q1}$ and Q2, $\overline{Q2}$. The clock terminal CL1 is connected to receive the reference signal fo and the signal fo is applied to the reset terminal R2. The clock terminal CL2 is connected to receive the signal fp, the phase of which is to be compared, and the signal fp is further applied to the reset terminal R1. The output terminal $\overline{Q1}$ is connected to the data terminal $\overline{D2}$. The output terminal Q2 is connected to the data terminal D1 and is also connected to one input of an OR gate 713. The output terminal Q1 is applied to one input of an AND gate 715. The phase difference signal generator 71 is connected to receive the signal PLL from the control 37. The signal PLL is applied directly to the other input of the AND gate 715 and is also applied, after inversion by means of an inverter 714, to the other input of the OR gate 713. The output of the OR gate 713 is connected to the gate of a P-channel field effect transistor 716 and the output of the AND gate 715 is connected to the gate of an N-channel field effect transistor 717. These field effect transistors 716 and 717 are connected in series and the phase difference signal is obtained from the series connection junction as a signal Sout. One end of the series connection of the field effect transistors 716 and 717 is connected to the voltage $V_{DD}$ and the other end of the series connection is connected to the ground. When the phase-locked loop is enabled, the signal Sout obtained from the phase difference signal generator 71 is applied to the tuning voltage generating circuit 23. The operation of the D type flip-flops 711 and 712 included in the phase difference signal generator 71 will be described in the following. More specifically, these D type flip-flops are responsive to the rise of the clock being supplied to the clock terminal CL to be operable and not responsive to the fall of the clock so there is no change in the output then. If and when the data terminal D is at the high level when the clock rises, the output Q also becomes the high level. Conversely, if and when the data terminal signal is at the low level when the clock rises, the output Q also becomes the low level. The output Sout of the phase difference signal generator 71 exhibits a 3-value state, i.e. "the high level", "the low level" and "the high impedance" as a function of the two inputs fo and fp. FIG. 11 shows a timing chart for explaining the operation of the phase difference signal generator 71. Referring to FIG. 11, if and when the signals fo and fp are in phase, i.e. such as on the occasion of the timing t1 shown in FIG. 11, the signal Sout becomes "the high impedance". If and when the signal fp advances in phase with respect to the reference signal fo as at the timing t2-t3 and t4t5 shown in FIG. 11, the signal Sout becomes "the high level". If and when the reference signal fo advances as compared with the signal fp such as at the timing t6-t7 in FIG. 11, the signal Sout becomes "the low level". The width or the time period of "the high level" or "the low level" of the signal Sout corresponds to the phase difference of these signals. Meanwhile, it has been adapted such that "the high level" of the outputs from the phase difference signal generator 71 and the previously described search control 43 is set to be higher than the threshold level $V_{SHA}$ of the window comparator 25 and "the low level" of the outputs therefrom is set to be lower than the threshold level $V_{SLA}$ of the window comparator 25.

Returning again to FIG. 1, five keys 45, 47, 49, 51 and 53 are coupled to the above described control 37 in the above described embodiment. The A/M key 45 is aimed to select the search operation to be an automatic mode or a manual mode. The UP key 47 and the DOWN key 49 are aimed to select the search directions, respectively. The MEMO key 51 is aimed to store the preset data for preset station selection in a channel memory 41. The CH key 53 is aimed to set a desired channel for preset station selection and accordingly comprises a plurality of keys.

A lock detecting circuit 75 is connected to the phase difference signal generating circuit 71. The lock detecting circuit 75 is aimed to detect whether the phase-locked loop has placed in a locked state or not. The signal LOCK being obtained as the high level when the locked state is detected is applied to the control 37. Meanwhile, the lock detecting circuit 75 may be that disclosed in U.S. Pat. No. 4,201,945 issued May 6, 1980 to Ohgishi et al.

Figure 13:
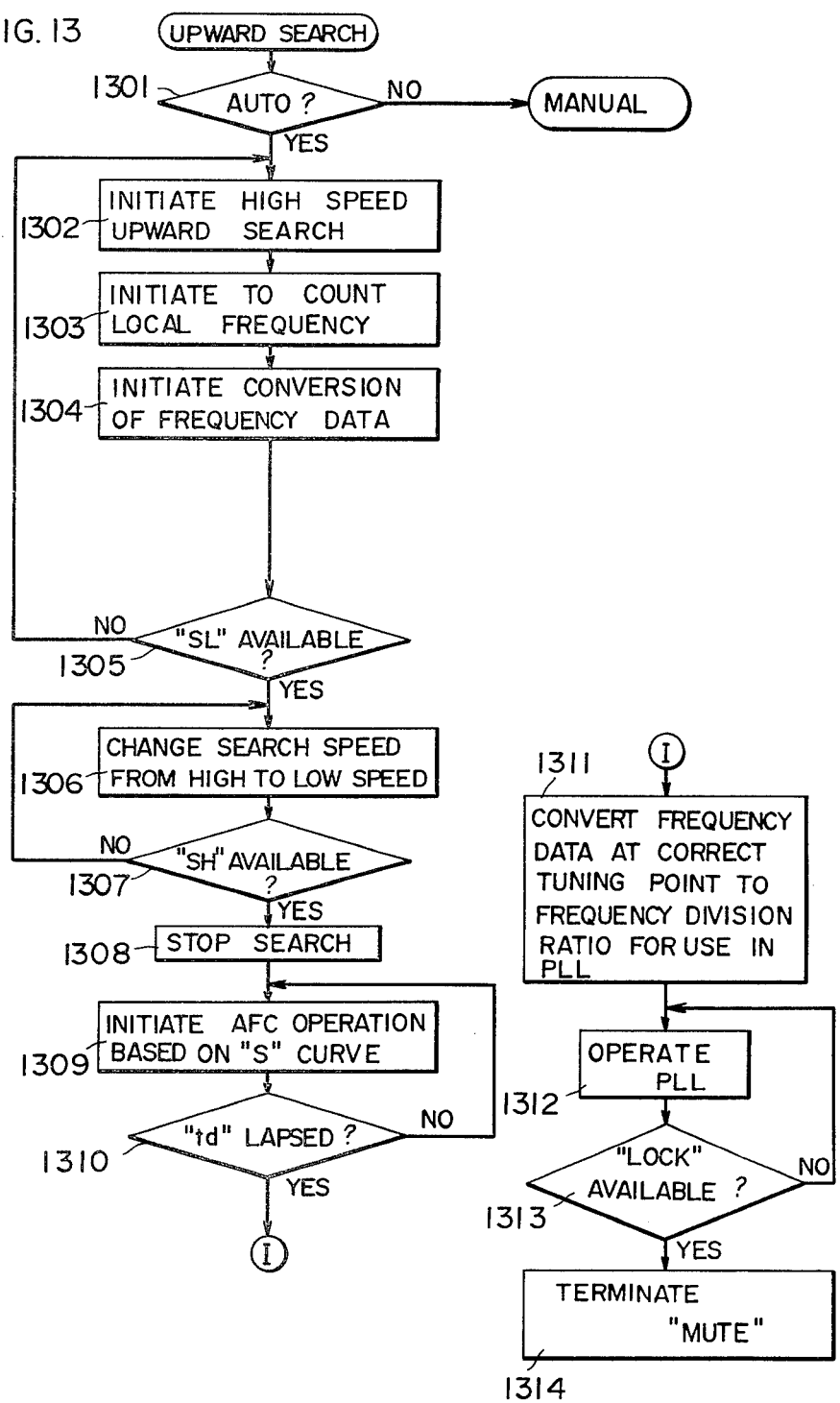
FIG. 13 is a flow diagram for explaining an operation of the FIG. 1 embodiment.
Figure 14:
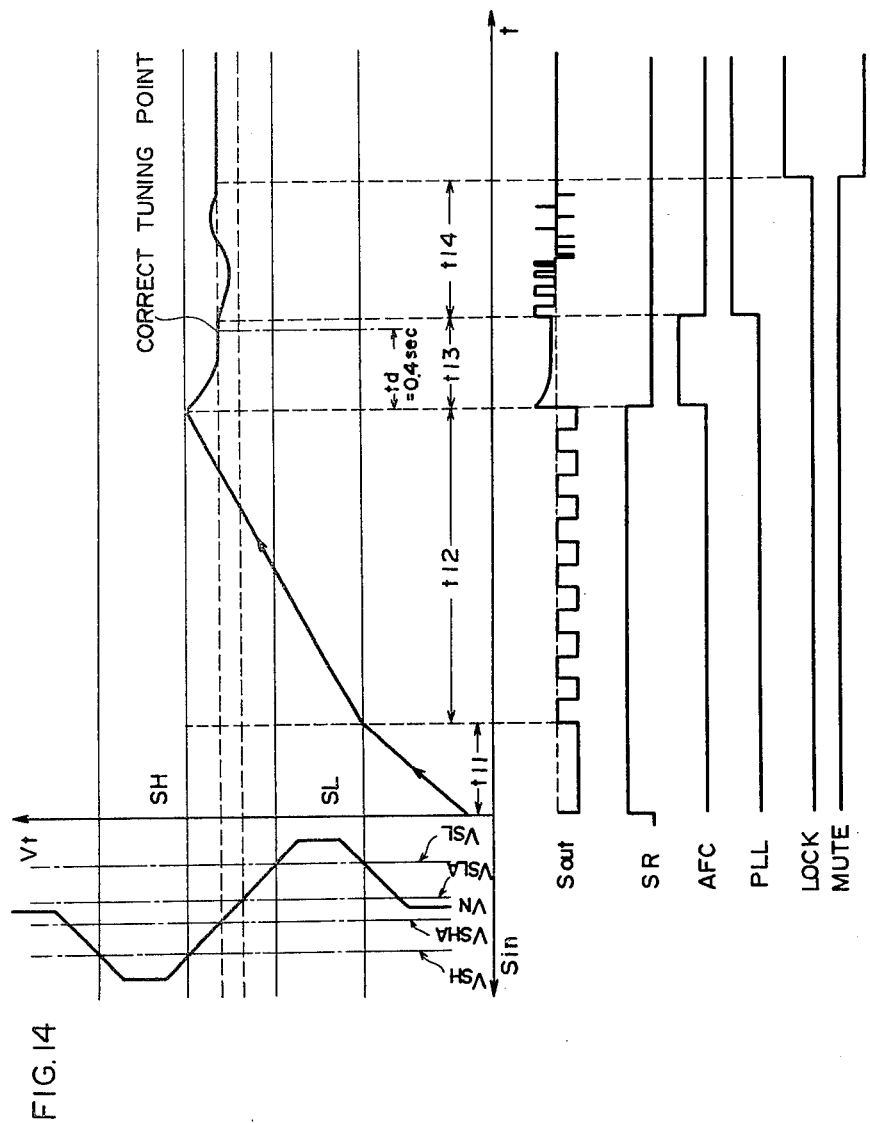
FIG. 14 is a timing chart for explaining one aspect of an operation of the FIG. 1 embodiment.

Now referring to FIGS. 13 and 14, one example of an operation of the FIG. 1 embodiment will be described. Figs. 13 and 14 show an operation in an automatic search mode in the upward direction. For the purpose of the automatic search mode in the upward direction, an operator first depresses an UP key 47 and then selects an automatic mode by means of an A/M key 45. At the first step 1301 the control 37 determines whether the operation is in the automatic mode. Since the UP key 47 has been depressed, the signal U/D obtained from the control 37 becomes the high level. At the beginning of the automatic mode, the signals, H/L and SR from the control 37 are both the high level. Accordingly, the search control 43 generates the output signal Sout at "the low level". A high speed upward directional search operation is initiated at the step 1302 during the time period t11 shown in FIG. 14 responsive to the signal Sout of "the low level" from the search control 43. Since the signal Sout is "the low level" in the high speed upward directional search, the output of one operational amplifier 252 of the window comparator 25 receiving the above described signal becomes the high level, whereby the switch, 271 of the constant current charge pump 27 is turned or closed. Therefore, the capacitors 291 and 292 (FIG. 2) of the low-pass filter 29 are charged with the current Is from the constant current source 275, whereby the tuning voltage Vt increases. The local oscillation frequency signal from the local oscillator 9 is applied through the prescaler 57 to the gate circuit 59 responsive to the operation of the high speed upward directional search. The signal PLL is the low level at that time in the gate circuit 59 and accordingly the output $f_{IN}$ of the prescaler 57 is applied from the AND gate 594 to the up-counter 61 as the signal CLK responsive to the time base signal TB applied through the AND gate 592. The up-counter 61 is responsive to the applied signal CLK to start a count operation of the local oscillation frequency at the step 1303.

Following the step 1303 the control 37 starts a frequency converting operation by the frequency converting circuit, not shown, included in the frequency display 73. The frequency converting operation is aimed at conversion to receiving frequency data at that time from the count value of the up-counter 61, i.e. the local oscillation frequency data. Typically, such converting circuit may be implemented by addition or subtraction of the intermediate frequency say 10.7 MHz. When the frequency conversion is thus started, the receiving frequency is displayed by the frequency display 73.

Even during that time period the tuning voltage Vt from the tuning voltage generating circuit 23 gradually increases as shown in FIG. 14 (the time period t11). Then a given broadcasting signal is caught as a result of a variation of the tuning voltage Vt. Accordingly, the control 37 always determines at the step 1305 whether the signal SL from the window comparator 31 is available first or not. In the case of the upward directional search first the signal SL will be obtained. More specifically, after the lapse of the time period t11 the S curve signal from the FM detector 13, i.e. the output signal Sin of the amplifier 19 becomes lower than the threshold level $V_{SL}$ of the window comparator 31 and at that time point the signal SL, which is at the high level, is applied from the window comparator 31 to the control 37.

When the signal SL is obtained, the control 37 turns the signal H/L to the low level, whereby the search speed is changed from the high speed to the low speed at the step 1306. When the signal H/L becomes the low level, the signal Sout from the search control 43 repeats "the low level" and "the high impedance" as shown as at the time period t12 in FIG. 14 responsive to the low speed search clock SCH-CLK obtained from the timing signal generator 67. More specifically, the N-channel field effect transistor 437 included in the search control 43 is rendered conductive each time the low speed clock SCH-CLK becomes the high level and accordingly the signal Sout is a repetition of "the low level" and "the high impedance". During the time period when the signal Sout is "the low level" the high speed search is carried out, whereas during the time period when the signal Sout is "the high impedance" the operation is stopped, with the result that during the time period t12 the search speed is made slow. While the low speed upward directional search is continued, in the meantime the signal SH is obtained from the window comparator 31. Accordingly, when the search speed is switched, the control 37 determines at the following step 1307 whether the signal SH is obtained. When the signal SH is obtained, the control 37 brings the signal SR to the low level and the signal AFC to the high level.

When the signal SR becomes the low level, the two field effect transistors 436 and 437 are both rendered non-conductive in the search control 43 (FIG. 5), whereby the signal Sout becomes "the high impedance". The search operation is brought to a stop at the step 1308. On the other hand, since the signal AFC becomes the high level, the analog switch 21 is accordingly rendered conductive, with the result that the S curve signal Sin is applied through the amplifier 19 to the tuning voltage generating circuit 23 as the input signal Sout. Accordingly, the automatic frequency control operation is initiated at the step 1309 as at the period t13 in FIG. 14 responsive to the S curve signal. The potential of the S curve signal Sin, when the automatic frequency control operation is started and the search operation is stopped, is approximately equal to the threshold level $V_{SH}$ of the window comparator 31 and is higher than the threshold level $V_{SHA}$ of the window comparator 25. Therefore, the input signal Sout of the window comparator 25 is instantateously brought to a high level. Further, when the input signal Sout of the window comparator 25 becomes "the high level" the output of the operational amplifier 251 becomes the high level. Therefore, the switch 272 included in the constant current charge pump 27 is turned on and the tuning voltage Vt from the low-pass filter 29 decreases. Accordingly, the receiver 1 is tuned to a more optimized tuning point (a correct tuning point) through the automatic frequency control operation as compared with the point in time when the search operation is brought to a stop. In other words, the optimum tuning point can be more readily established by performing the automatic frequency control operation prior to the operation of the phase-locked loop. As described previously, the receiver has been assumed to regard the optimum tuning point as established after the lapse of a predetermined time period td from the start of the automatic frequency control operation. Accordingly, the control 37 determines at the step 1310 whether the above-described predetermined time period td has lapsed since the signal AFC was brought to the high level. After the lapse of the above-described time period td, the control 37 provides the signal SUB to the frequency division ratio data converting circuit 39 and therefore the local oscillation frequency data at the optimum tuning point from the up-counter 61 is converted to the "N" value for the phase-locked loop, i.e. the frequency division ratio data, whereupon the converted frequency division ratio data is latched through the data bus 55 to the latch circuit 63 at the step 1311.

Then after the lapse of the automatic frequency control operation period t13, the control 37 brings the signal AFC to the low level and at the same time brings the signal PLL to the high level (FIG. 14). Thus, when the "N" value for the phase-locked loop is obatained at the step 1311, then at the step 1312 the phase-locked loop is operated during the period t14 in FIG. 14.

Meanwhile, the local oscillation frequency data at the optimum tuning point obtained from the up-counter 61 after the lapse of the predetermined time period td is stored in the buffer memory, not shown, included in the frequency display 73, whereby the receiving frequency is displayed based on the stored data. More specifically, the receiving frequency of the optimum tuning point is displayed by the frequency display 73.

When the signal PLL becomes the high level, the output of the OR gate 593 of the gate circuit 59 (FIG. 6) becomes the high level and the signal $f_{IN}$ from the prescaler 59 is provided from the AND gate 594 as the signal CLK to the up-counter 61 and accordingly, as described previously, the up-counter 61, the latch circuit 63 and the frequency division detecting circuit 65 together constitute a programmable frequency divider of the phase-locked loop. The output signal Sout from the phase difference signal generating circuit 71 (FIG. 10) is released from being locked in "the high impedance".

More specifically, when the signal PLL becomes the high level, the up-counter 61 frequency divides the signal $f_{IN}$ based on the frequency division ratio data "N" value at the optimum tuning point, whereby the frequency division detecting circuit 65 provides the signal f/N at each frequency division. The signal f/N (fp) and the reference signal fo from the timing signal generator 67 are applied to the phase difference signal generator 71. The circuit 71 provides the output Sout as a function of the frequency difference and/or the phase difference between the applied two signals fp and fo. The output Sout from the phase difference signal generator 71 is applied to the tuning voltage generator 23 shared in the phase-locked loop. At that time the switch 294 of the low-pass filter 29 included in the tuning voltage generator 23 is turned off responsive to the signal PLL. At the same time the constant current path of the charge pump 27 is switched. More specifically, since the signal PLL becomes the high level, the corresponding constant current sources 277 and 278 are selected in the charge pump 27 (a state shown in FIG. 2). Since such tuning control by means of the phase-locked loop is well-known as a frequency synthesizer system as described previously, it is not believed necessary to describe the same in more detail. It is determined at the step 1313 whether the phase-locked loop is locked during the phase-locked loop operation period t14 shown in FIG. 14. When the phase-locked loop is locked, the signal LOCK is obtained from the lock detecting circuit 75 and the control 37 is responsive to the signal LOCK to bring the signal MUTE to the low level, thereby to release the muting function which acted upon the low frequency amplifier 15. Then the broadcasting signal in reception is reproduced from the speaker 17 at the step 1314.

Figure 12:
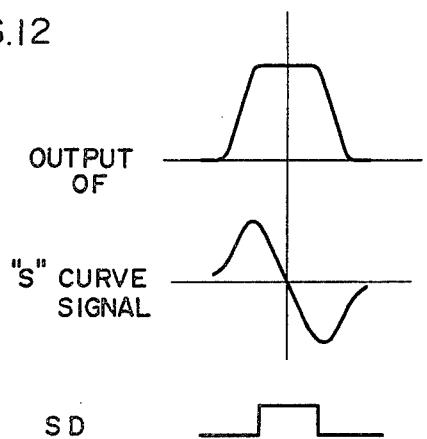
FIG. 12 is a graph showing waveforms for explaining an operation of a tuning detecting circuit.

As described in the foregoing, normally the optimum tuning point is established by the search operation and the automatic frequency control operation, whereupon the optimum tuning point is maintained by the phase-locked loop operation but in the presence of the broadcasting signal the automatic frequency control operation can be continued to reproduce the broadcasting signal without the operation being switched to the phaselocked loop operation. However, in the absence of a broadcasting signal or in the case of an extremely weak broadcasting wave, the operation is preferably switched from the automatic frequency control operation to the phase-locked loop operation to receive the signal. To that end, the embodiment shown comprises a broadcasting signal detecting circuit 33 for receiving the output from the intermediate frequency amplifier 11 and the S curve signal from the FM detector 13. The broadcasting signal detecting circuit 33 is responsive to these two given signals to provide a broadcasting signal detected signal SD representing that the receiver 1 shown in FIG. 12 has caught a broadcasting signal. The control 37 continues the previously described automatic frequency control operation to reproduce a sound in the presence of the signal SD and switches the operation from the automatic frequency control operation to the phase-locked loop operation to reproduce a sound in the absence of the signal SD. When the signal SD is obtained during the phase-locked loop operation, the operation is again switched to the automatic frequency control operation to reproduce a sound. Thus, the operation may be switched between the automatic frequency control operation and the phase-locked loop operation; based on the presence and absence of the broadcasting signal.

It would be apparent that the FIG. 1 embodiment can form not only station selection or reception by an automatic search described in the foregoing but also a manual search station selection and preset station selection.

In the case of the manual search station selection an operator selects a manual mode by means of the A/M key 45. On the other hand, an operator keeps depressed the UP key 47 or the DOWN key 49 looking at the frequency displayed by the frequency display 73. Upon each depression of the UP key 47 or the DOWN key 49 a predetermined frequency say 0.1 MHz in the case of an FM receiver is added or subtracted. Accordingly a broadcasting signal of a desired frequency can be selected by operation of these keys 47 and/or 49.

On the occasion of preset station selection, the local oscillation frequency of the optimum tuning point obtained by the previously described automatic search or the manual search and/or the frequency division ratio data of the programmable frequency divider are stored in the channel memory 41 for each channel through operation of the MEMO key 51 and the CH key 53. On the occasion of station selection a key corresponding to a desired channel included in the CH key 53 is operated. Then the local oscillation frequency and/or the frequency division ratio data stored in the channel memory 41 is read out. In the case where the local oscillation frequency is stored in the channel memory 41, conversion is made to the frequency division ratio data by means of the frequency division ratio data converting circuit 39 based on the read local oscillation frequency data, and the same is latched in the latch circuit 63. In the case where the frequency division ratio data is stored in the channel memory 41, the read frequency division ratio data is latched through the data bus 55 in the latch circuit 63. Accordingly, preset station selection is performed by enabling the phase-locked loop including the programmable frequency divider implemented by the up-counter 61, the latch circuit 63 and the frequency division detecting circuit 65.

Figure 15:
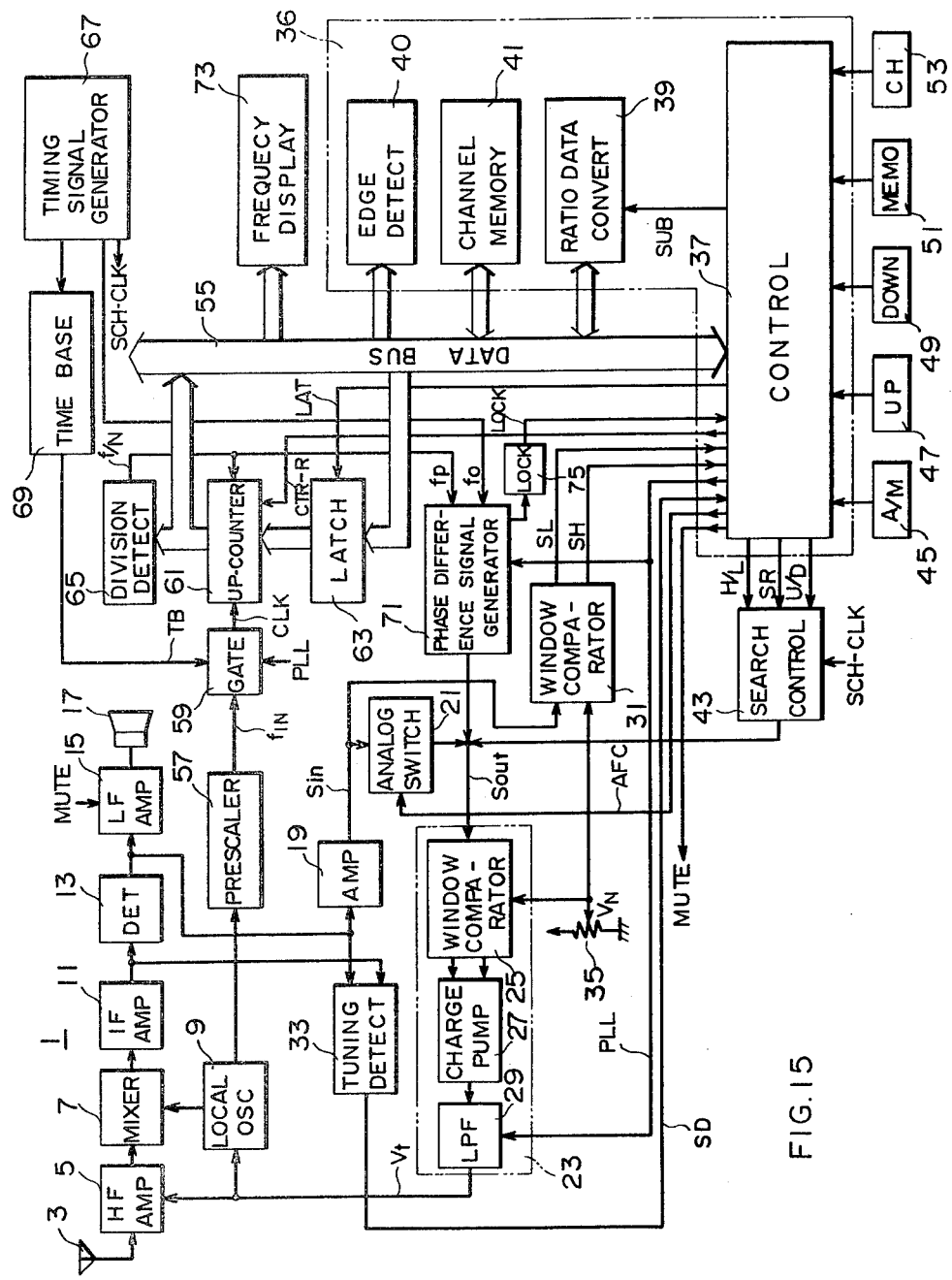
FIG. 15 is a block diagram showing another embodiment of the present invention.

FIG. 15 is a block diagram showing another embodiment of the present invention. The embodiment shown is proposed for the purpose of avoiding reception of the frequencies exceeding the range of the frequency band as allowed. Generally the frequency band has been regulated by the law or regulation of each country. For example, the FM broadcasting in Japan has been regulated such that the upper edge frequency is 90.0 MHz and the lower edge frequency is 76.0 MHz. Likewise each country has its own regulation. Therefore, a tuning control apparatus of a receiver having an automatic search function needs to restrict a receivable frequency to the upper edge and/or the lower edge of the frequency band in order to prevent the frequencies which are not allowed from being received i.e. frequencies that exceed the range of the frequency band. For example, a conventional voltage synthesizer system was adapted such that a tuning voltage for controlling the local oscillation frequency is restricted to a voltage corresponding to a given predetermined value, i.e. the edge frequency, by the use of a semifixed resistor. However, such an approach causes fluctuation of the upper limit and/or the lower limit of such tuning voltage in accordance with a fluctuation of a source voltage, for example. Accordingly, in a certain circumstance it could happen that a frequency outside the allowed frequency band is still receivable. Therefore, in the FIG. 15 embodiment the upper edge frequency and the lower edge frequency, or the local oscillation frequency corresponding to the upper edge frequency and the local oscillation frequency corresponding to the lower edge frequency, or the frequency division ratio data corresponding to the upper edge frequency and the frequency division ratio data corresponding to the lower edge frequency are stored. Then the data is monitored based on the numerical value as stored to see whether the receiving frequency or the local oscillation frequency or the frequency division ratio data has exceeded the stored numerical value corresponding to the edge frequency. In the case where the receiving frequency or the local oscillation frequency or the frequency division ratio data changes so as to exceed such edge frequency or the local oscillation frequency corresponding to the edge frequency or the frequency division ratio data corresponding to the edge frequency, the phase-locked loop is enabled so that the receiving frequency is forced or locked to such edge frequency.

In comparison with the previously described FIG. 1 embodiment, the FIG. 15 embodiment is different in that the edge detecting circuit 40 is provided. Accordingly, in the following the FIG. 15 embodiment will be described centering mainly on the function and operation of the edge detecting circuit 40, while a detailed description of the remaining portions will be omitted. First, the case where the local oscillation frequency $f_L$ corresponding to the edge frequency is stored will be described.

The edge detecting circuit 40 is provided in the circuit 36, such as a microprocessor. The edge detecting circuit 40 is a circuit for detecting whether the local oscillation frequency exceeded the local oscillation frequency corresponding to the upper edge frequency and/or the lower edge frequency of the frequency band allowed in the receiver 1.

Figure 17:
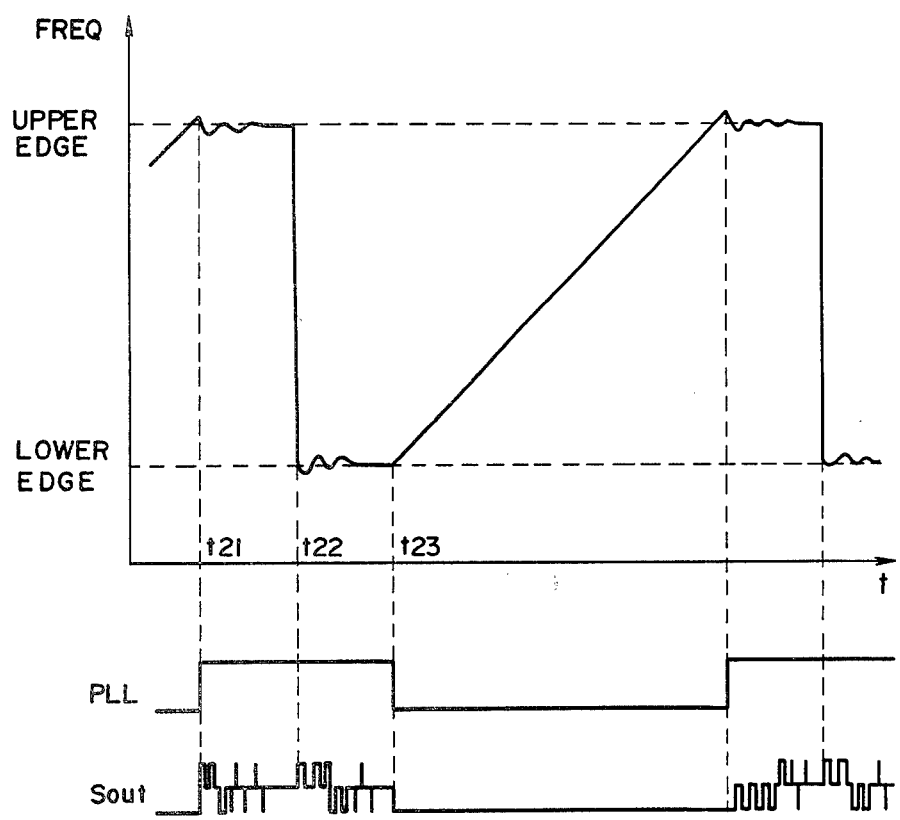
FIG. 17 is a timing chart for explaining an operation of one aspect of the FIG. 15 embodiment.
Figure 16:
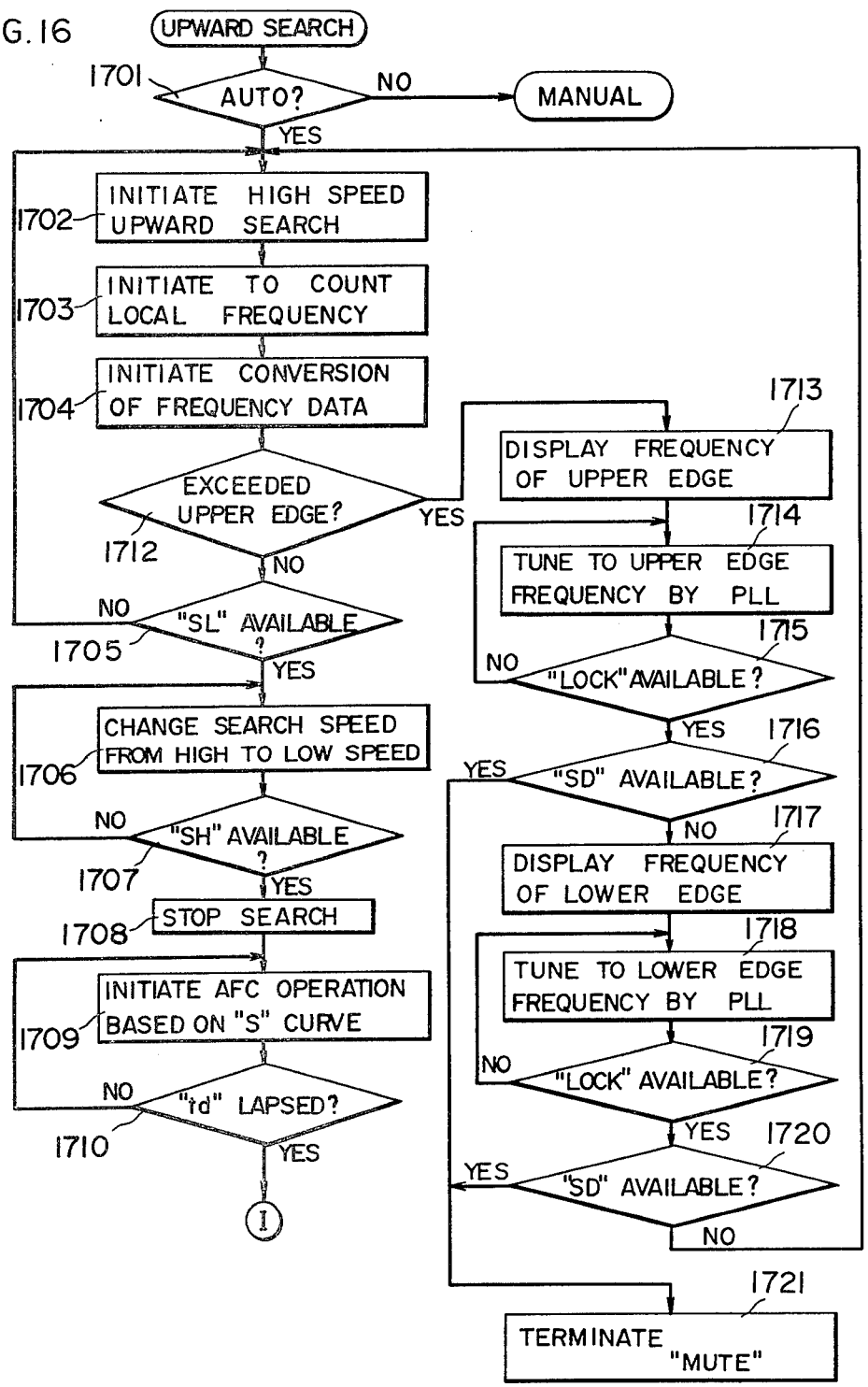
FIG. 16 is a flow diagram for explaining a major portion of one aspect of an operation of the FIG. 15 embodiment.

FIG. 16 is a flow diagram for explaining one example of an operation of the FIG. 15 embodiment and FIG. 17 is a timing chart for explaining one example of such operation. The FIG. 16 embodiment is different from the previously described FIG. 13 embodiment at the steps 1712 to 1721. Now referring to FIGS. 16 and 17, an operation of the FIG. 16 embodiment will be described. The control 37 determines at the step 1712 following the step 1704 whether the signal DET is obtained from the edge detecting circuit 40. More specifically, at the step 1712 the control 37 determines whether the local oscillation frequency has exceeded the frequency corresponding to the edge frequency. Since the operation in such a situation is an upward directional search, at the step 1712 it is determined whether the local oscillation frequency has exceeded the frequency corresponding to the upper edge frequency. In the case where it is determined at the step 1712 that the local oscillation frequency has exceeded the frequency corresponding to the upper edge frequency the upper edge frequency is displayed at the step 1713 by the frequency display 73 at the time t21 shown in FIG. 17. The local oscillation frequency corresponding to the upper edge frequency is converted into the frequency division ratio data for the phase-locked loop by means of the frequency division ratio data converting circuit 39. The converted frequency division ratio data is latched in the latch circuit 63. Accordingly, the receiver 1 is tuned at the step 1714 to the frequency of the upper edge by means of the phase-locked loop at the time t21 in FIG. 17. It is detected at the step 1715 by the lock detecting circuit 75 whether the phase-locked loop is locked and upon detection that the phase-locked loop is locked, the control 37 determines whether the signal SD has been obtained from the broadcasting signal detecting circuit 33. More specifically, at the step 1716 it is determined whether a broadcasting signal is obtained at the upper edge. If and when a broadcasting signal is obtained at the upper edge, then at the step 1721 the signal MUTE is brought to the low level and the broadcasting signal is reproduced as a sound. If and when no broadcasting signal is obtained at the upper edge, then at the step 1717 the lower edge frequency is displayed by the frequency display 73. Then at the step 1718 the receiver is tuned to the lower edge at the time t23 in FIG. 17 by means of the phase-locked loop, as done at the previously described step 1714 for the upper edge. Then at the step 1719 it is determined whether the phase-locked loop is locked, as done at the previously described step 1715 and at the step 1720 it is determined whether the signal SD is available, as done at the previously described step 1716. In the absence of the signal SD, i.e. in the absence of a broadcasting signal at the lower edge, the operation returns to the step 1702 and the automatic search operation is restarted. If and when a broadcasting signal is available at the lower edge, the operation returns to the previously described step 1721.

Although the above described embodiment was adapted such that the automatic search operation is restarted responsive both to the signal LOCK obtained from the lock detecting circuit 75 and the signal SD obtained from the broadcasting signal detecting circuit 33, the same may be adapted such that the automatic search operation may be restarted responsive to either the signal LOCK or the signal SD.

In the foregoing description, when the local oscillation frequency exceeds the frequency corresponding to the upper edge of the frequency band the phase-locked loop is first enabled and the receiving frequency is forced to the upper edge frequency at the time t21 and then the same is forced to the lower edge frequency at the time t22, whereupon a search operation in the upward direction is restarted at the timing t23. However, alternatively, whenever the local oscillation frequency exceeds the frequency corresponding to the upper edge, the receiving frequency may be immediately forced to the lower edge frequency without the same being forced to the upper edge frequency, whereupon a search operation may be restarted. In the case where the upper edge and lower edge receiving frequencies are employed as the numerical values associated with the edge frequencies being stored, these edge frequencies need to be converted once to the corresponding local oscillation frequencies and then the local oscillation frequencies corresponding to these edge frequencies need to be converted to the frequency division ratio data. Therefore converting means for converting the edge frequencies to the corresponding local oscillation frequencies need to be provided in addition to the frequency division ratio data converting circuit 39 for converting the local oscillation frequency to the frequency division ratio data. Furthermore, since the stored data is the receiving frequency in such a case, the edge detecting circuit 40 must comprise converting means for converting the local oscillation frequency data from the up-counter 61 to the receiving frequency. However, the converting means for converting the edge frequency, i.e. the receiving frequency to the local oscillation frequency, and the converting means for conversely converting the local oscillation frequency to the receiving frequency may commonly employ the frequency converting circuit in display 73, inasmuch as the frequency converting circuit included in the frequency display 73 involves such converting function, as described previously.

In the case where the frequency division ratio data corresponding to the upper edge and the lower edge is used as the numerical values associated with the edge frequencies being stored, the local oscillation frequency data obtained from the up-counter 61 on the occasion of the search operation may always be converted into the frequency division ratio data by providing the subtraction command signal SUB from the control 37 to the frequency division ratio data converting circuit 39 during the search operation and the automatic frequency control operation. By doing so, the local oscillation frequency data which is varying on the occasion of the search operation is converted into the frequency division ratio data and the said frequency division ratio data and the frequency division ratio data corresponding to the edge frequency as stored are compared by the edge detecting circuit 40. In such a case, since the data as stored is the frequency division ratio data corresponding to the edge frequency, the frequency division ratio data corresponding to these edge frequencies may be latched into the latch circuit 63 without conversion.

As described in the foregoing, even by storing the local oscillation frequency corresponding to the edge frequency or the frequency division ratio data without storing the edge frequency, the receiving frequency may be forced to the edge frequency.

In order to further determine whether the receiving frequency exceeds a predetermined edge frequency, further modifications set forth in the following may be considered. The receiving frequency data may be stored as the edge data, for example, the previously-described embodiment was structured such that the local oscillation frequency data obtained from the couter 61 was converted into the receiving frequency data, whereupon both were compared. However, the embodiment may be structured such that the receiving frequency data stored in the edge detecting circuit 40 is converted into the local oscillation frequency data, whereupon the converted local oscillation frequency data corresponding to the edge receiving frequency and the local oscillation frequency data obtained from the counter 61 are compared. Likewise, in the case where the receiving frequency data is stored as the edge data, the embodiment may be structured such that the receiving frequency data is convered into the frequency division ratio data while the local oscillation frequency data obtained from the counter 61 is converted into the frequency division ratio data whereupon these two converted frequency division ratio data are compared. Furthermore, in the case where the frequency division ratio data is stored as the edge data, the embodiment may be further modified such that the frequency division ratio data is converted into the local oscillation frequency data in the edge detecting circuit 40, whereupon the converted local oscillation frequency data and the local oscillation frequency data from the counter 61 are compared. Similarly, in the case where the edge frequency division ratio data is to be stored, the embodiment may also be structured such that the edge frequency division ratio data is converted into the receiving frequency data and the same is compared with the receiving frequency data obtained through conversion by the frequency display 73. A point is that the data for comparison for detection in the edge detecting circuit 40 of the embodiment should be the data of the same dimension ultimately, such as the receiving frequency versus receiving frequency, the local oscillation frequency versus local oscillation frequency, or the frequency division ratio versus the frequency division ratio, and a conversion process for obtaining such final data may be arbitrarily selected.

In addition, the previously-described embodiment was structured such that when the receiving frequency exceeds a predetermined edge frequency the local oscillation frequency data obtained from the counter 61 at that time is converted into a frequency division ratio, whereupon a tuning operation was controlled by means of the phase-locked loop by using the frequency division ratio. However, the embodiment may also be structured such that the frequency data and the frequency division ratio data (both correspond to the edge frequencies) are stored in the edge detecting circuit 40 and it is determined based on the frequency data whether the receiving frequency has exceeded the edge frequency. When the receiving frequency does exceeds the edge frequency, the above described frequency division ratio data stored therein is utilized to control a tuning operation through the phase-locked loop. In particular, it is determined whether the receiving frequency has exceeded a predetermined edge frequency and a frequency division ratio corresponding to the edge frequency is utilized to control a tuning operation through the phase-locked loop.

In the above described case, if a downward directional search is commanded, the relationship between the upper edge and the lower edge becomes the reverse of that in the foregoing description. Thus, according to the embodiment shown, the receiver 1 will not be tuned to a frequency outside the range of the allowed frequency band by exceeding the upper edge and/or the lower edge and accordingly the receiver can be assuredly adapted to a frequency allotting regulation of each country.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuning control apparatus of a receiver having an electronic tuner for tuning to the broadcast signals of broadcasting stations, said tuner including high frequency receiving means with voltage-controlled oscillator means for determining the tuning frequency of said high frequency receiving means as a function of a given tuning voltage applied to the voltage-controlled oscillator means, said tuning control apparatus comprising:

tuning state signal providing means for providing a tuning state signal representative of the tuning state of the tuner with respect to a broadcasting station signal;

automatic searching means for changing the tuning frequency of said high frequency receiving means to search for and locate a broadcasting station signal, said searching means producing a locate signal when a broadcasting station signal is located, said automatic searching means including a voltage synthesizer means which includes means responsive to said tuning state signal for continuously changing a tuning voltage to be applied to said voltage-controlled oscillator;

phase-locked loop means for holding the tuning frequency of said high frequency receiving means, said phase-locked loop means including frequency dividing means which includes means programmable for frequency dividing the frequency of the ouput from said voltage-controlled oscillator means to generate a divided output signal, reference signal generating means for generating a reference signal, difference signal producing means means for comparing the divided output signal of said frequency dividing means and said reference signal, and producing a difference signal associated with at least one of a frequency difference and phase difference between said two signals, and said voltage synthesizer means includes means responsive to the output of said difference signal producing means for generating a tuning voltage to be applied to said voltage-controlled oscillator means;

said frequency dividing means includes means for counting a frequency of the signal from said voltage-controlled oscillator means for obtaining frequency data associated with a receiving frequency being received by said high frequency receiving means, data converting means for converting said frequency data associated with the receiving frequency obtained from said means for counting into frequency division ratio data for use in said programmable frequency dividing means included in said phase-locked loop means when the broadcasting station signal is located by said automatic searching means;

means for setting the frequency division ratio data for the receiving frequency from said data converting means into said frequency dividing means included in said phase-locked loop means; and selecting means for enabling said phase-locked loop means in place of said automatic searching means in response to the locate signal produced when the broadcasting station signal is located by said automatic searching means.

2. A tuning control apparatus in accordance with claim 1 wherein said means responsive to said tuning state signal and said means responsive to the output of said difference signal producing means have a common low-pass filter means, said low-pass filter means having a given time constant and having means for changing the time constant in accordance with a time constant signal from said selecting means, and said selecting means comprises time constant selecting means for selecting said time constant of said low-pass filter means on the occassion of selective enabling of said phase-locked loop means by said automatic searching means and generating the time constant signal in response thereto.

3. A tuning control apparatus in accordance with claim 1, wherein said tuning state signal providing means is a frequency descriminator means included in said receiver.

4. A tuning control apparatus in accordance with claim 1 wherein said means responsive to such tuning state signal and said means responsive to the output of said difference signal producing means have a common tuning voltage generating circuit.

5. A tuning control apparatus in accordance with claim 1 wherein said means programmable for frequency dividing comprises latch means for latching the frequency division ratio data from said data converting means, counter means for frequency dividing said local oscillation frequency as a function of said frequency division ratio data as latched in said latch means, and frequency division detecting means for generating said frequency division output as a function of the data in said counter means, and further wherein said means for counting a frequency of the signal from said voltage-controlled oscillator means and said counter means have a common counter circuit.

6. A tuning control apparatus in accordance with claim 1, wherein said automatic searching means comprises automatic frequency control means for performing an automatic frequency control operation by supplying said tuning state signal to said responsive to said tuning state signal via a switch means.

7. A tuning control apparatus in accordance with claim 6, wherein said responsive to said tuning state signal first window comparator means at the input stage thereof for level detecting the input signal at first and second threshold voltage levels, said second threshold voltage level being selected to be higher than said first threshold voltage level, said automatic searching means comprises second window comparator means at the input stage thereof for level detecting said tuning state signal at a third and fourth threshold voltage levels, said fourth threshold voltage level being selected to be higher than said third threshold voltage level, said fourth threshold voltage level being selected to be higher than said second threshold voltage level and said third threshold voltage level being selected to be lower than said first threshold voltage level.

8. A tuning control apparatus in accordance with claim 2, 4, 5, 6, 7, 1 or 3, wherein said voltage-controlled oscillator means is structured such that the oscillation frequency may be varied to cover at least one frequency band, and which further comprises edge detecting means for storing the numerical data associated with each of the upper edge frequency and the lower edge frequency of said frequency band for detecting whether the numerical data associated with said receiving frequency by said high frequency receiving means has become higher than said numerical data associated with said upper edge frequency or lower than said numerical data associated with said lower edge frequency during the search performed by said automatic searching means, frequency forcing means responsive to the output from said edge detecting means for enabling said phase-locked loop means for forcing the tuning frequency of said high frequency receiving means to at least one of said upper edge frequency and said lower edge frequency.

9. A tuning control apparatus in accordance with claim 8, which further comprises locked state detecting means for detecting whether said phase-locked loop means is placed in a locked state, and means responsive to the output from said locked state detecting means for selectivley reenabling said automatic searchin means.

10. A tuning control apparatus in accordance with claim 8, wherein said frequency forcing means comprises means for setting the frequency division ratio data corresponding to at least one of said upper edge frequency and said lower edge frequency into said means programmable for frequency dividing included in said phase-locked loop means.

11. A tuning control apparatus in accordance with claim 10, wherein said frequency forcing means comprises means for converting at least one of the numerical data associated with said upper edge frequency and the numerical data associated with said lower edge frequency to frequency division ratio data for use in said means programmable for frequency dividing including in said phase-locked loop means.

12. A tuning control apparatus in accordance with claim 11, wherein said edge detecting means comprises means for converting the frequency data obtained from said means for counting a frequency to said receiving frequency by said high frequency receiving means.

13. A tuning control apparatus in accordance with claim 10, wherein said edge detecting means comprises means for converting the data obtained from said means for counting a frequency to said frequency division ratio data for use in said means programmable for frequency dividing included in said phase-locked loop means.

14. A tuning control apparatus in accordance with claim 8, which further comprises means responsive to the locate signal for selectively reenabling said automatic searching means.

* * * * *